United States Patent
Xu et al.

(10) Patent No.: US 12,153,344 B2
(45) Date of Patent: *Nov. 26, 2024

(54) LITHOGRAPHY METHOD TO FORM STRUCTURES WITH SLANTED ANGLE

(71) Applicant: Applied Materials, Inc., Santa Clara, CA (US)

(72) Inventors: Yongan Xu, Santa Clara, CA (US); Jinxin Fu, Fremont, CA (US); Jhenghan Yang, San Jose, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/241,705

(22) Filed: Sep. 1, 2023

(65) Prior Publication Data
US 2023/0408913 A1    Dec. 21, 2023

Related U.S. Application Data

(63) Continuation of application No. 17/534,128, filed on Nov. 23, 2021, now Pat. No. 11,754,919.
(Continued)

(51) Int. Cl.
*G03F 7/00*     (2006.01)
*G02B 6/122*    (2006.01)
(Continued)

(52) U.S. Cl.
CPC ........... *G03F 7/0007* (2013.01); *G02B 6/122* (2013.01); *G02B 6/136* (2013.01)

(58) Field of Classification Search
None
See application file for complete search history.

(56) References Cited

U.S. PATENT DOCUMENTS 6,692,902 B2    2/2004   Wong et al.
10,775,158 B2   9/2020   Olson et al.
(Continued)

FOREIGN PATENT DOCUMENTS

JP    2006058334 A    3/2006

OTHER PUBLICATIONS

International Search Report and Written Opinion dated Mar. 16, 2022 for Application No. PCT/US2021/060520.

*Primary Examiner* — Shamim Ahmed
(74) *Attorney, Agent, or Firm* — Patterson + Sheridan, LLP

(57) ABSTRACT

The present disclosure generally relates to methods of forming optical devices comprising nanostructures disposed on transparent substrates. A first process of forming the nanostructures comprises depositing a first layer of a first material on a glass substrate, forming one or more trenches in the first layer, and depositing a second layer of a second material in the one or more holes to trenches a first alternating layer of alternating first portions of the first material and second portions of the second material. The first process is repeated one or more times to form additional alternating layers over the first alternating layer. Each first portion of each alternating layer is disposed in contact with and offset a distance from an adjacent first portion in adjacent alternating layers. A second process comprises removing either the first or the second portions from each alternating layer to form the plurality of nanostructures.

20 Claims, 7 Drawing Sheets

Related U.S. Application Data

(60) Provisional application No. 63/119,497, filed on Nov. 30, 2020.

(51) Int. Cl.
   *G02B 6/136* (2006.01)
   *H01L 21/3065* (2006.01)

(56) References Cited

U.S. PATENT DOCUMENTS

| | | |
|---|---|---|
| 11,247,298 B2 | 2/2022 | Evans et al. |
| 11,754,919 B2 * | 9/2023 | Xu .................. G02B 6/122 216/24 |
| 2002/0151178 A1 | 8/2002 | Lai |
| 2002/0135717 A1 | 9/2002 | Liu |
| 2004/0082178 A1 * | 4/2004 | Kamins .................. C30B 11/00 438/691 |
| 2007/0003839 A1 | 1/2007 | Rabarot et al. |
| 2011/0279818 A1 | 11/2011 | Amako et al. |
| 2016/0035539 A1 | 2/2016 | Sainiemi et al. |
| 2018/0081265 A1 | 3/2018 | Singh |
| 2020/0301062 A1 | 9/2020 | Young et al. |
| 2020/0409151 A1 | 12/2020 | Calafiore |

\* cited by examiner

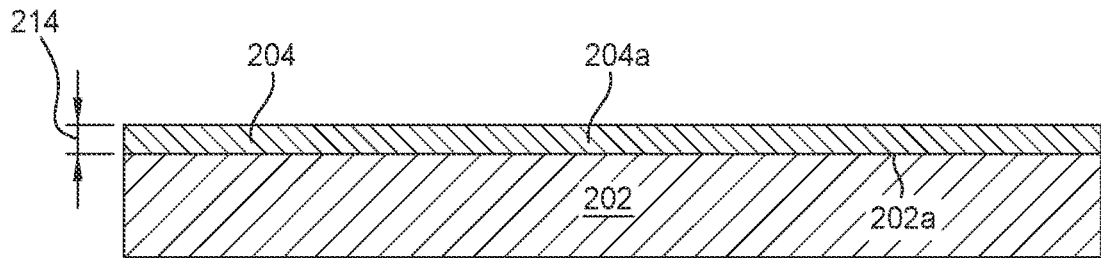
FIG. 2A
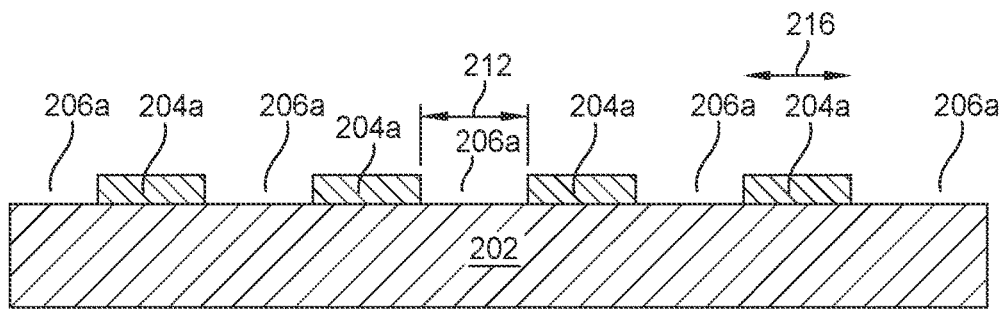
FIG. 2B
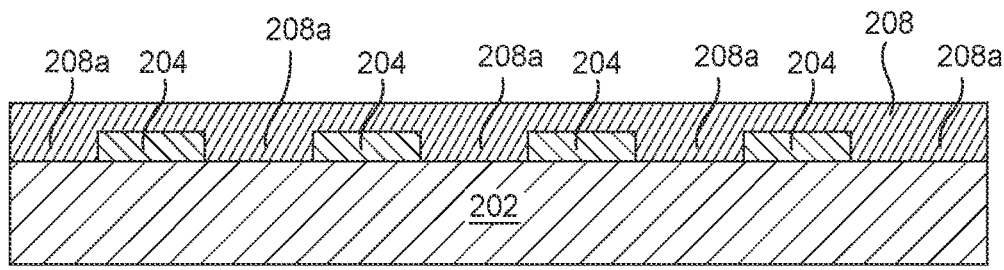
FIG. 2C
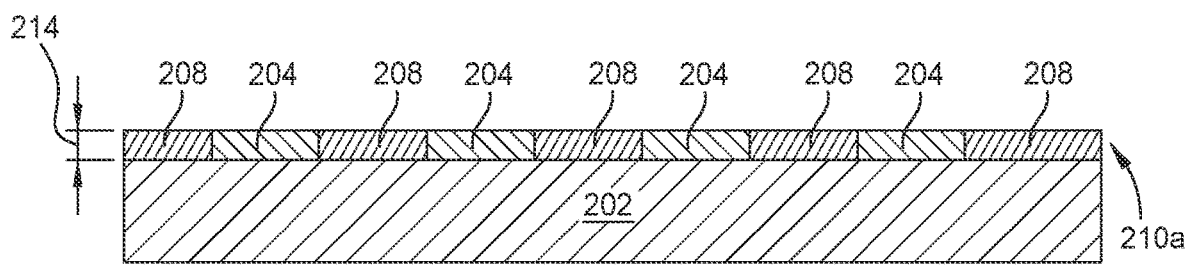
FIG. 2D
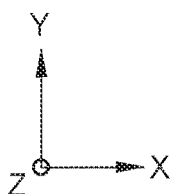

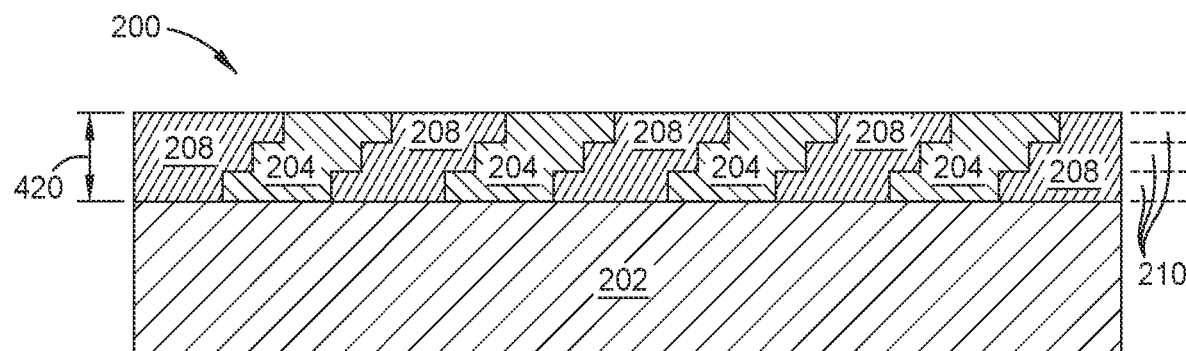
FIG. 4A
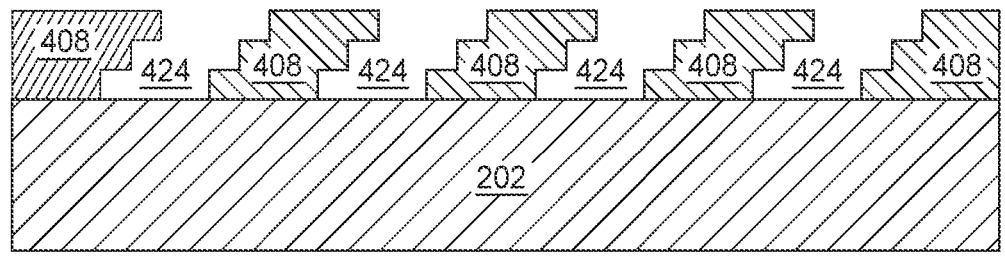
FIG. 4B
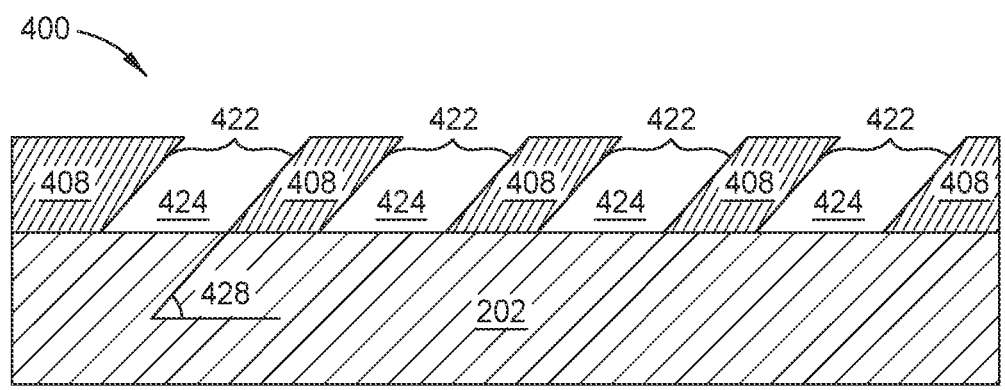
FIG. 4C
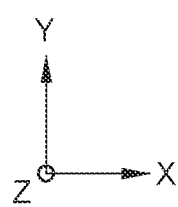

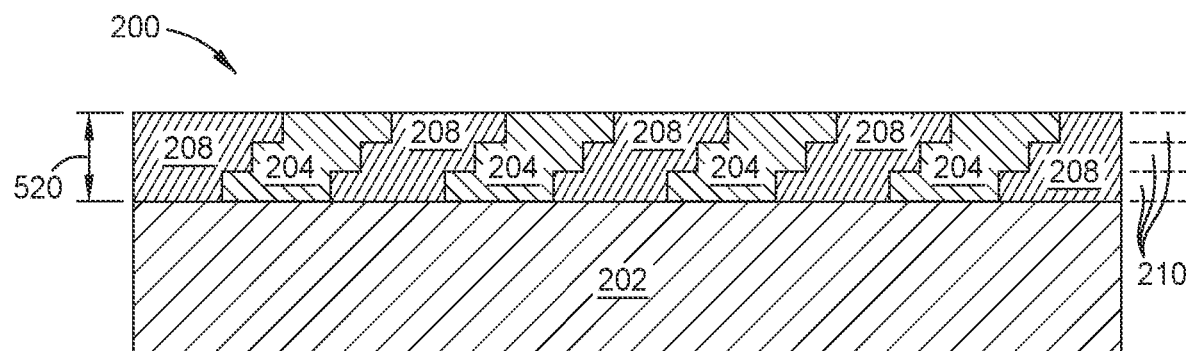
FIG. 5A
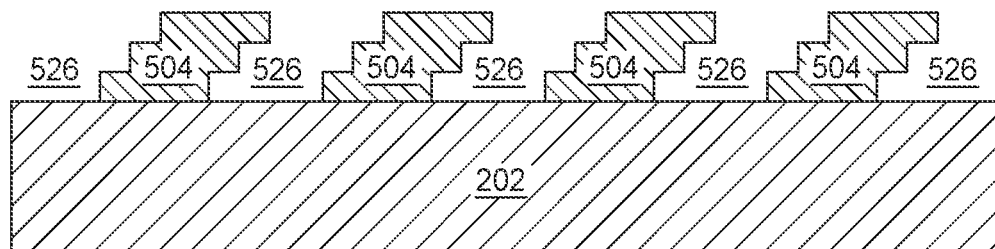
FIG. 5B
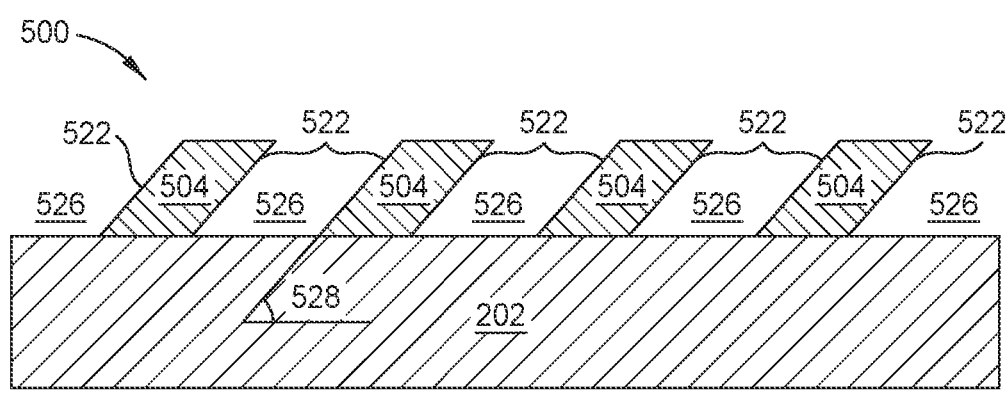
FIG. 5C
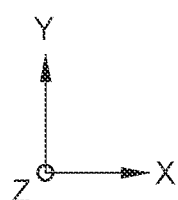

LITHOGRAPHY METHOD TO FORM STRUCTURES WITH SLANTED ANGLE

CROSS-REFERENCE TO RELATED APPLICATIONS

This application is a continuation of U.S. patent application Ser. No. 17/534,128, filed Nov. 23, 2021, which claims benefit of U.S. provisional patent application No. 63/119,497, filed Nov. 30, 2020, which are both herein incorporated by reference in their entireties.

BACKGROUND

Field

Embodiments of the present disclosure generally relate to methods of forming optical devices comprising nanostructures disposed on transparent substrates.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels, such as lenses, to display a virtual reality environment that replaces an actual environment.

Augmented reality also enables an experience in which a user can see through the display lenses of the glasses or other HMD device to view the surrounding environment, but also enables the user to see images of virtual objects that are generated for display and appear as part of the environment. Augmented reality can include any type of input, such as audio and haptic inputs, as well as visual images, graphics, and video that enhances or augments the real environment that the user experiences. As an emerging technology, there are many challenges and design constraints with augmented reality.

One such challenge is displaying a virtual image overlaid on an ambient environment. Waveguides comprising a plurality of nanostructures are used to assist in overlaying images. Generated light is propagated through a waveguide until the light exits the waveguide and is overlaid on the ambient environment. Due to the size of the plurality of nanostructures, the formation process can be difficult to accurately control. FIGS. 1A-1B illustrate a conventional method of forming a plurality of nanostructures 108 of a waveguide 100, according to one embodiment. In FIG. 1A, a first material 104 is deposited on a top surface 102a of the substrate 102. A patterned hard mask 106 is deposited on the first material 104.

In FIG. 1B, portions 112 of the first material 104 uncovered by the hard mask 106 are removed or etched using ion beams 110 to form a plurality of slanted nanostructures 108. As used herein, slanted refers to an angle offset from both the x-axis and the y-axis, such as being angled in the xy-direction. In other words, the plurality of slanted nanostructures 108 are neither parallel nor perpendicular to the top surface 102a of the substrate. The slanted profile of the plurality of nanostructures 108 is controlled by the angle of ion beams 110, which is difficult to control and often requires over-etching in order to ensure each nanostructure 108 has a consistent thickness or width in the x-direction throughout. As such, the over-etching may cause portions 114 of the substrate 102 to be inadvertently removed.

Therefore, there is a need in the art for an improved method of forming nanostructures.

SUMMARY

The present disclosure generally relates to methods of forming optical devices comprising nanostructures disposed on transparent substrates. A first process of forming the nanostructures comprises depositing a first layer of a first material on a glass substrate, forming one or more trenches in the first layer, and depositing a second layer of a second material in the one or more trenches to form a first alternating layer of alternating first portions of the first material and second portions of the second material. The first process is repeated one or more times to form additional alternating layers over the first alternating layer. Each first portion of each alternating layer is disposed in contact with and offset a distance from an adjacent first portion in adjacent alternating layers. A second process comprises removing either the first or the second portions from each alternating layer to form the plurality of nanostructures.

A method of forming a plurality of slanted nanostructures using a lithography tool comprises performing a first process comprising: depositing a first layer of a first material on a first surface of a transparent substrate, removing one or more first portions of the first layer of the first material to form one or more trenches, and depositing a first layer of a second material in the one or more trenches to form a first alternating layer comprising alternating first remaining portions of the first material disposed in contact with second remaining portions of the second material, the second material being different than the first material. The method further comprises repeating the first process one or more times to form one or more additional alternating layers over the first alternating layer, wherein each first remaining portion of each alternating layer is disposed in contact with and offset a first distance from an adjacent first remaining portion in adjacent alternating layers. The method further comprises performing a second process comprising: removing each second remaining portion from each alternating layer, and etching sidewalls of each first remaining portion to smooth the sidewalls to form the plurality of slanted nanostructures comprising the first material, wherein each of the plurality of slanted nanostructures is disposed at an angle from 0° to about 90° from the first surface of the transparent substrate.

A method of forming a plurality of slanted nanostructures using a lithography tool comprises performing a first process comprising: depositing a first layer of a first material on a transparent substrate, removing one or more first portions of the first layer of the first material to form one or more trenches, depositing a first layer of a second material over the first material and in the one or more trenches, the second material being different than the first material, and etching and planarizing the first layer of the second material to form a first alternating layer comprising first remaining portions of the first material disposed in contact with second remaining portions of the second material, the first alternating layer having a thickness from about 10 nm to about 100 μm. The method further comprises repeating the first process one or more times to form one or more additional alternating layers over the first alternating layer, wherein each second remaining portion of each alternating layer is disposed in contact with and offset a first distance from an adjacent second remaining portion in adjacent alternating layers. The method further comprises performing a second process comprising:

removing each first remaining portion from each alternating layer, and etching sidewalls of each second remaining portion to form the plurality of slanted nanostructures comprising the second material.

A method of forming a plurality of slanted nanostructures using a lithography tool comprises performing a first process comprising: depositing a first layer of a first material on a first surface of a transparent substrate, the first material comprising Ti, Sb, Sn, Zr, Al, or Hf, removing one or more first portions of the first layer of the first material to form one or more trenches, and depositing a first layer of a second material in the one or more trenches to form a first alternating layer comprising alternating first remaining portions of the first material disposed in contact with second remaining portions of the second material, the second material comprising an organic planarization layer, spin on glass, SiN, or a Si containing material. The method further comprises repeating the first process one or more times to form one or more additional alternating layers over the first alternating layer, wherein each first remaining portion of each alternating layer is disposed in contact with and offset a first distance from an adjacent first remaining portion in adjacent alternating layers, and wherein each first remaining portions has a first width, the first width being greater than the first distance. The method further comprises performing a second process comprising: removing either each first remaining portion or each second remaining portion from each alternating layer to form the plurality of slanted nanostructures, and etching sidewalls of each of the plurality of slanted nanostructures to smooth the sidewalls.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 2A-2H illustrate various views of forming a nanostructure base, according to disclosed embodiments.

FIGS. 4A-4C illustrate various views of forming a nanostructure from the nanostructure base of FIGS. 2A-2H, according to disclosed embodiments.

FIGS. 5A-5C illustrate various views of forming a nanostructure from the nanostructure base of FIGS. 2A-2H, according to disclosed embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the disclosure. However, it should be understood that the disclosure is not limited to specific described embodiments. Instead, any combination of the following features, elements, and embodiments, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to methods of forming optical devices comprising nanostructures disposed on transparent substrates. A first process of forming the nanostructures comprises depositing a first layer containing a first material on a glass substrate, forming one or more trenches in the first layer, and depositing a second layer containing a second material in the one or more trenches to form a first alternating layer, the first alternating layer containing first portions including the first material and second portions including the second material. The first process is repeated one or more times to form additional alternating layers over the first alternating layer. Each first portion of each alternating layer is disposed in contact with and offset a distance from an adjacent first portion in adjacent alternating layers. A second process includes removing either the first or the second portions from each alternating layer to form the plurality of nanostructures.

FIGS. 2A-2H illustrate various views of forming a nanostructure base 200, or a first process in forming a plurality of nanostructures, according to disclosed embodiments. The nanostructure base 200 will be used to form a nanostructure comprising a plurality of slanted structures, such as a waveguide, as described further below in FIGS. 4A-6B.

Figure 1A:
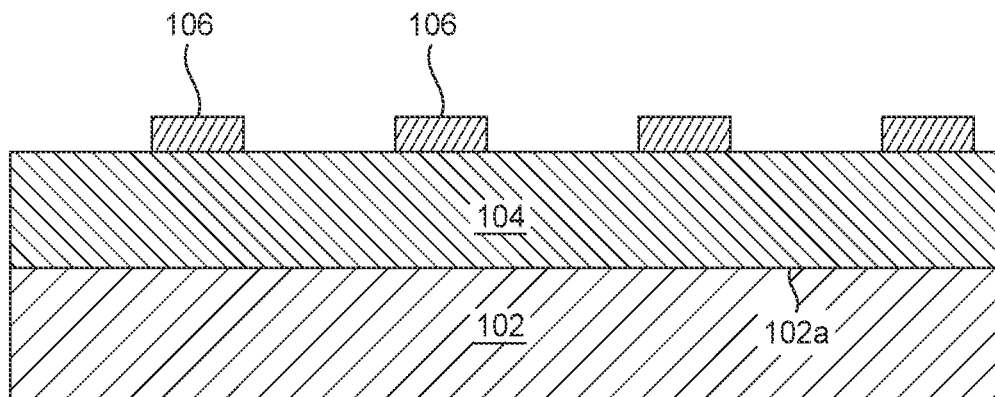
FIGS. 1A-1B illustrate a conventional method of forming a plurality of nanostructures of a waveguide, according to one embodiment.
Figure 1B:
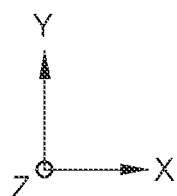
Figure 1B:
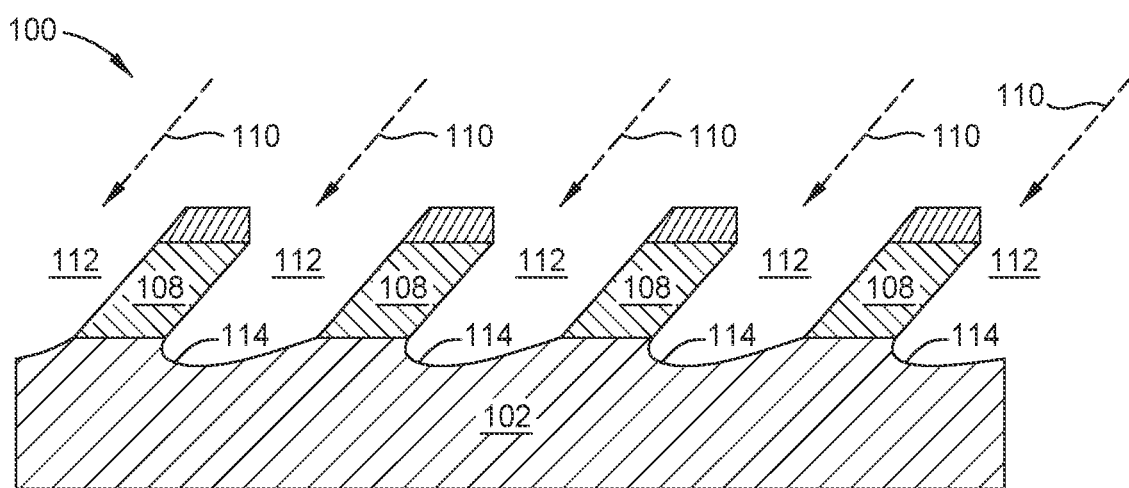
Figure 2E:
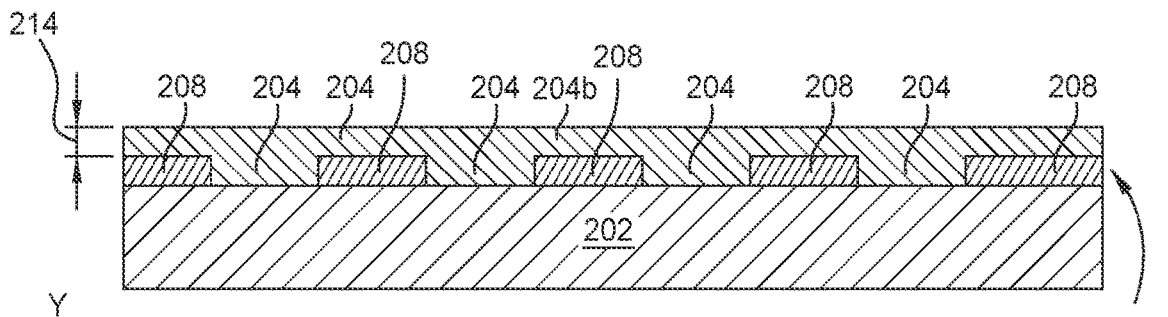
Figure 2F:
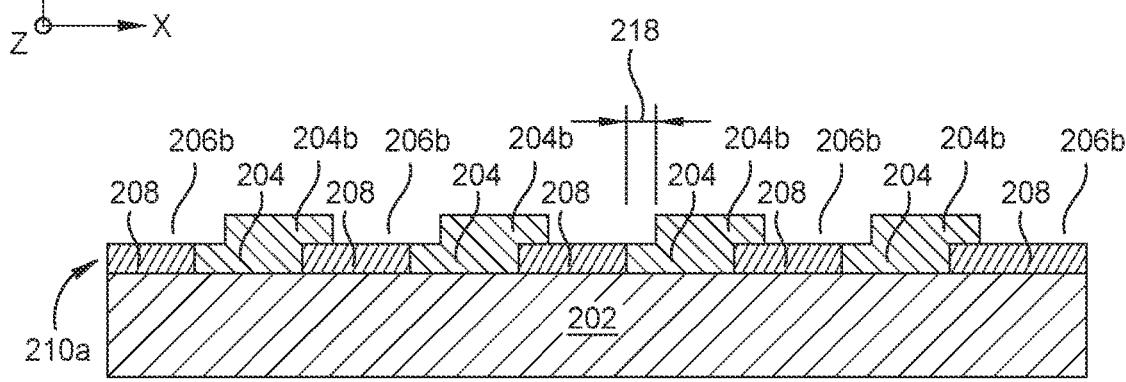
Figure 2G:
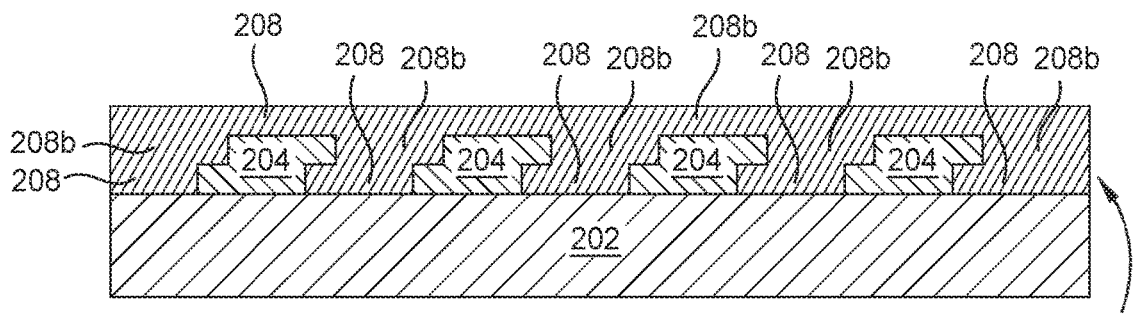
Figure 2H:
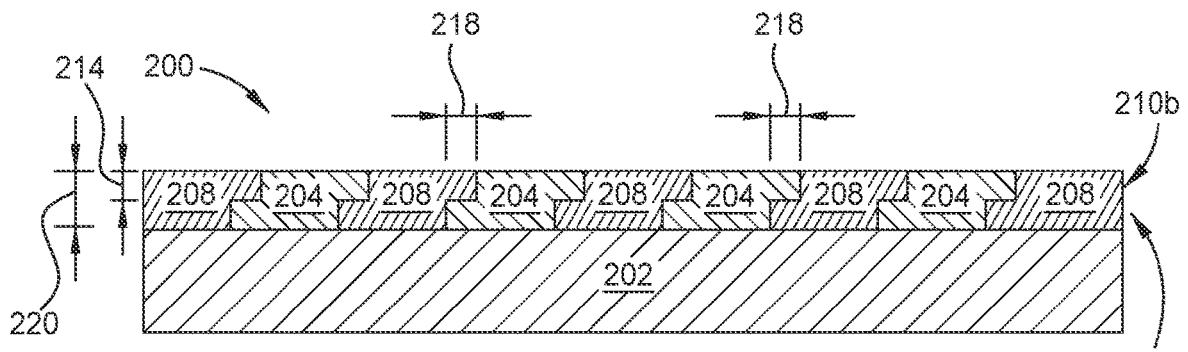
Figure 3:
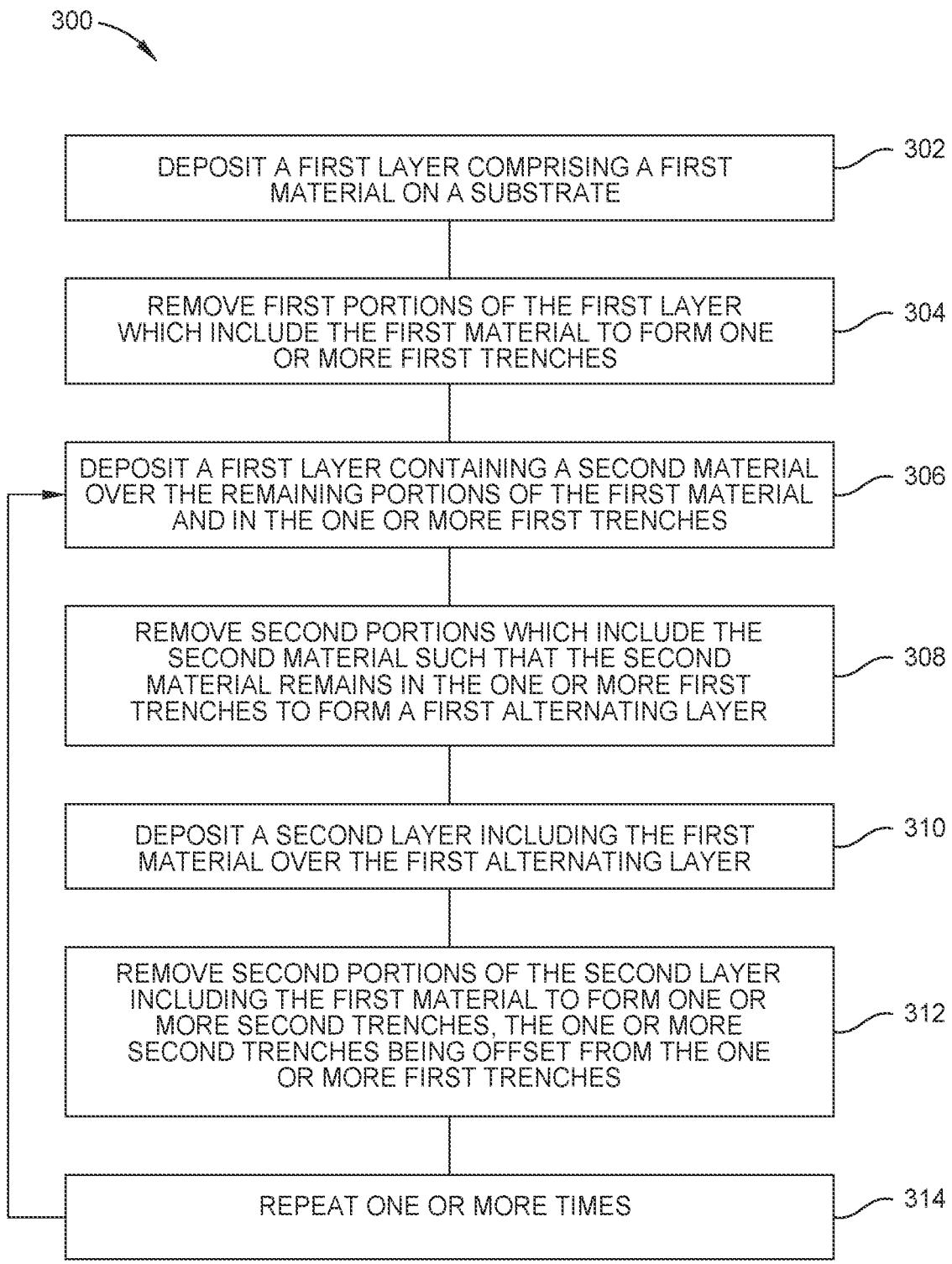
FIG. 3 illustrates a method of forming the nanostructure base of FIGS. 2A-2H, according to one embodiment.

FIG. 3 illustrates a method 300 of forming the nanostructure base 200, or the first process in forming the plurality of nanostructures, according to one embodiment. Thus, FIGS. 2A-2H are described with FIG. 3. The method 300 is performed using a lithography tool. For example, lithography tools that may be used include g-line, h-line, i-line, 248 nm, 193 nm, 193 nm immersion (193i), Talbot Lithography, or extreme ultraviolet lithography (EUV).

In operation 302, a first layer 204a containing a first material 204 is deposited on a first surface 202a of a transparent substrate 202, as shown in FIG. 2A. The first layer 204a may be deposited using the lithography tool. In some embodiments, the first material 204 includes a metal. For example, the first material 204 may include Ti, Sb, Sn, Zr, Al, or Hf, among others. The first layer 204a has a first thickness 214 in the y-direction from about 10 nm to about 100 µm, such as from about 30 nm to about 500 nm. For example, the first thickness 214 may be from about 10 nm to about 1 µm when utilizing EUV, 193, and 193i lithography tools, or from about 100 nm to about 100 µm when utilizing g-line, h-line, and i-line lithography tools, such as from about 100 nm to about 5 µm. In some embodiments, the substrate 202 includes glass.

In operation 304, first portions of the first layer 204a which include the first material 204 are removed to form one or more first trenches 206a, as shown in FIG. 2B. The first portions of the first layer 204a may be removed to form the one or more first trenches 206a through lithography patterning of the lithography tool. Each of the first trenches 206a have a same width 212 in the x-direction. Similarly, each remaining portion of the first material 204 has a same width 216 in the x-direction. The width 212 and the width 216 may each individually be from about 20 nm to about 5,000 nm. As such, each remaining portion of the first material 204 is spaced a same distance apart in the x-direction, the distance being equal to the width 212 of the first trenches 206a. In some embodiments, the width 212 of the first trenches 206a is equal to the width 216 of the remaining portions of the first material 204. While five first trenches 206a are shown, any number of first trenches 206a may be formed, and the number of first trenches 206a is not intended to be limiting.

In operation 306, a first layer 208a containing a second material 208 is deposited over the remaining portions of the first material 204 and in the one or more first trenches 206a, as shown in FIG. 2C. The second material 208 may be an organic planarization layer (OPL), spin on glass, SiN, or other Si containing materials, among others. In some embodiments, the first material 204 comprises OPL, spin on glass, SiN, or other Si containing materials, and the second material 208 comprises Ti, Sb, Sn, Zr, Al, or Hf. In operation 308, a top portion of the first layer 208a containing the second material 208 is removed through planarization and etching such that the second material 208 remains in the one or more first trenches 206a to form a first alternating layer 210a having a first thickness 214, as shown in FIG. 2D.

In operation 310, a second layer 204b of the first material 204 is deposited over the first alternating layer 210 using the lithography tool, as shown in FIG. 2E. In some embodiments, the second layer 204b has the same thickness 214 as the first layer 204a. However, the second layer 204b may have a different thickness than the first layer 204a. In operation 312, second portions of the second layer 204b which include the first material 204 are removed to form one or more second trenches 206b through lithography patterning of the lithography tool, as shown in FIG. 2F. The second portions of the second layer 204b may be removed to form the one or more second trenches 206b through lithography patterning, as described above in operation 304. The same number of first trenches 206a and the same number of second trenches 206b may be formed.

Each of the one or more second trenches 206b is offset a first distance 218 in the x-direction from the one or more first trenches 206a, now filled with the second material 208. As such, the first material 204 of the first alternating layer 210a is offset the first distance 218 in the x-direction from the remaining portion of the second layer 204b of the first material 204 while still maintaining contact. The first distance 218 is from about 1 nm to about 5 µm. For example, the first distance 218 is from about 10 nm to about 50 nm when utilizing 193 and 248 lithography tools (e.g., from about 10 nm to about 20 nm), from about 500 nm to about 5 µm when utilizing g-line, h-line, and i-line lithography tools, and from about 1 nm to about 50 nm when utilizing EUV and 193i lithography tools (e.g., from about 1 nm to about 5 nm). The first distance 218 does not exceed the width 216 of the portions containing the first material 204. Due to the alignment capabilities of lithography tools, the alignment of the first distance 218, or the alignment of the one or more second trenches 206b to the one or more first trenches 206a, is accurately controlled.

In operation 314, operations 306-312 are repeated one or more times. Thus, as shown in FIG. 2G, a second layer 208b including the second material 208 is deposited over the first alternating layer 210a and in the one or more second trenches 206b. A top portion of the second layer 208b containing the second material 208 is then removed through planarization and etching such that the second material 208 remains only in the one or more second trenches 206b to form a second alternating layer 210b having the first thickness 214, as shown in FIG. 2H.

By repeating operations 306-312 of the method 300 one or more times, additional alternating layers (collectively referred to as alternating layers 210) containing the first material 204 and the second material 208 are formed, where the first material 204 of an alternating layer 210 is offset the first distance 218 in the x-direction with the first material 204 of the adjacent alternating layers 210. Similarly, the second material 208 of an alternating layer 210 is offset the first distance 218 in the x-direction with the second material 208 of the adjacent alternating layers 210. Each alternating layer 210 has a planar surface substantially parallel to the first surface 202a of the substrate 202. Once all of alternating layers 210 collectively reach a desired height 220 in the y-direction, the nanostructure base 200 is complete and the method 300 ends.

As used herein, the first distance 218 may be used interchangeably with an offset distance 218, which refers to the distance each portion containing the first material 204 in an alternating layer 210 is offset from adjacent portions containing the first material 204 in adjacent alternating layers 210 and the distance each portion containing the second material 208 in an alternating layer 210 is offset from adjacent portions containing the second material 208 in adjacent alternating layers 210. As noted above, the offset distance 218 cannot exceed the width of each portion containing the first material 204 or each portion containing the second material 208, as adjacent portions containing the first material 204 in adjacent alternating layers 210 are in contact with one another, and adjacent portions containing the second material 208 in adjacent alternating layers 210 are in contact with one another.

Figure 6A:
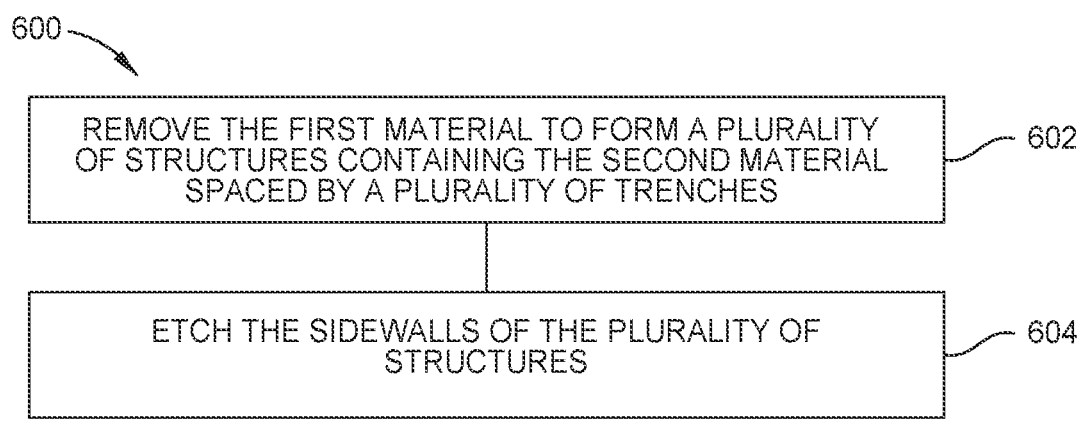
FIG. 6A illustrates a method of forming the nanostructure of FIGS. 4A-4C, according to one embodiment.
Figure 6B:
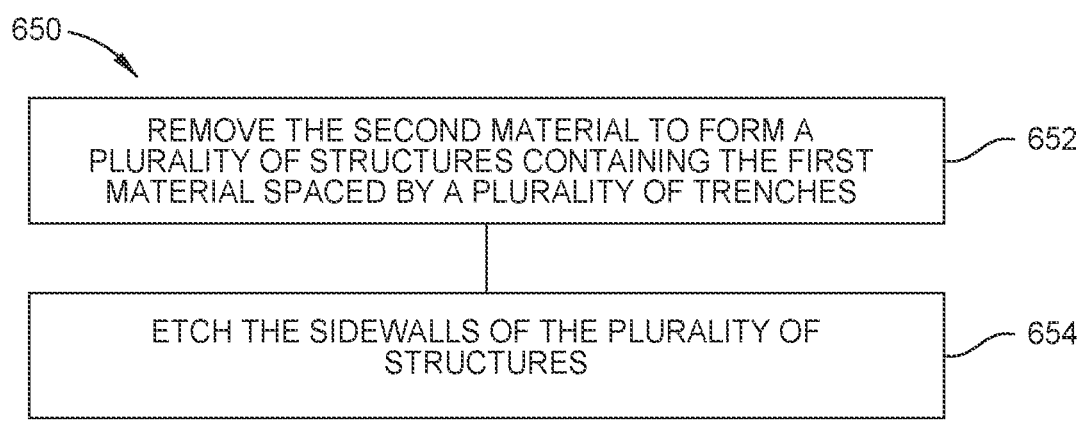
FIG. 6B illustrates a method of forming the nanostructure of FIGS. 5A-5C, according to one embodiment.

FIGS. 4A-4C illustrate various views of forming a nanostructure 400 from the nanostructure base 200 of FIGS. 2A-2H, or a second process in forming the plurality of nanostructures, according to embodiments. The nanostructure 400 may be a waveguide. FIGS. 5A-5C illustrate various views of forming a nanostructure 500 from the nanostructure base 200 of FIGS. 2A-2H, or an alternate second process in forming the plurality of nanostructures, according to embodiments. The nanostructure 500 may be a waveguide. FIG. 6A illustrates a method 600 of forming the nanostructure 400 of FIGS. 4A-4C, according to some embodiments. FIG. 6B illustrates a method 650 of forming the nanostructure 500 of FIGS. 5A-5C, according to some embodiments. Thus, FIGS. 4A-4C are described with FIG. 6A, and Figures are described with FIG. 6B.

Method 300 may be used with both method 600 and method 650. For example, upon completing method 300, method 600 may then be used. For example, upon completing method 300, method 650 may then be used. Methods 600 and 650 may each, individually, be performed using a lithography tool. For example, lithography tools that may be used include g-line, h-line, i-line, 248 nm, 193 nm, 193i, or EUV.

FIG. 4A illustrates the nanostructure base 200 formed using the method 300 above. The nanostructure base 200 comprises a plurality of alternating layers 210 having a height 420 in the y-direction. The height 420 is from about 20 nm to about 1 µm. In some embodiments, the height 420 is from about 20 nm to about 2 µm. While three alternating layers 210 are shown, the nanostructure base 200 may have any number of alternating layers 210, and the number of alternating layers 210 is not intended to be limiting.

In operation 602 of method 600, the first material 204 is removed to form a plurality of nanostructures 408 containing the second material 208, as shown in FIG. 4B. The plurality of nanostructures 408 are spaced by a plurality of trenches 424 where the first material 204 was previously disposed. In embodiments where the first material 204 comprises Ti, Sb, Sn, Zr, Al, or Hf, the first material 204 may be removed through oxide etching. The first material 204 is removed while still being disposed on the substrate 202.

In operation 604, the sidewalls 422 of the plurality of nanostructures 408 are etched such that the sidewalls 422 are substantially smooth or planar and are disposed at a slant angle 428, as shown in FIG. 4C. In embodiments where the second material 208 comprises OPL, spin on glass, SiN, or other Si containing materials, the sidewalls 422 may be etched using $CH_3F$, $CH_4$, $CHF_3$, $CF_4$, $O_2$, or Cl. The plurality of nanostructures 408 are etched while still being disposed on the substrate 202. The etching of the sidewalls 422 is relatively minor, resulting in the total dielectric volume of each of the plurality of nanostructures 408 being substantially unaffected by the etching.

The slant angle 428 may be from 0° to about 90°. The slant angle 428 may be dependent based on the offset distance 218, or the distance each second material 208 portion of an alternating layer 210 is offset from each second material 208 portion of an adjacent alternating layer 210, as described above in FIGS. 2A-2H. Since the offset distance 218 of each alternating layer 210 is accurately aligned due to being deposited by the lithography tool, the slant angle 428 can be accurately controlled.

FIG. 5A illustrates the nanostructure base 200 formed using the method 300 above. The nanostructure base 200 comprises a plurality of alternating layers 210 having a height 520 in the y-direction. The height 520 is from about 20 nm to about 1 μm. In some embodiments, the height 520 is from about 20 nm to about 2 μm. The angle size 428 and 528 may determine the height 420 and 520, respectively, by controlling the number of alternating layers 210. While three alternating layers 210 are shown, the nanostructure base 200 may have any number of alternating layers 210, and the number of alternating layers 210 is not intended to be limiting.

In operation 652 of method 650, the second material 208 is removed to form a plurality of nanostructures 504 containing the first material 204, as shown in FIG. 6B. The plurality of nanostructures 504 are spaced by a plurality of trenches 526 where the second material 208 was previously disposed. In embodiments where the second material 208 comprises OPL, spin on glass, SiN, or other Si containing materials, the second material 208 may be removed through a SiN etch. The second material 208 is removed while still being disposed on the substrate 202.

In operation 654, the sidewalls 522 of the plurality of nanostructures 504 are etched such that the sidewalls 522 are substantially smooth or planar and are disposed at a slant angle 528, as shown in FIG. 5C. In embodiments where the first material 204 comprises Ti, Sb, Sn, Zr, Al, or Hf, the sidewalls 522 may be etched using $CH_3F$, $CH_4$, $CHF_3$, $CF_4$, or $O_2$. The plurality of nanostructures 504 are etched while still being disposed on the substrate 202. The etching of the sidewalls 522 is relatively minor, resulting in the total dielectric volume of each of the plurality of nanostructures 504 being substantially unaffected by the etching.

The slant angle 528 may be from 0° to about 90°. The slant angle 528 may be dependent based on the offset distance 218, or the distance each first material 204 portion of an alternating layer 210 is offset from each first material 204 portion of an adjacent alternating layer 210, as described above in FIGS. 2A-2H. Since the offset distance 218 of each alternating layer 210 is accurately aligned due to being deposited by the lithography tool, the slant angle 528 can be accurately controlled.

Thus, by utilizing a lithography tool, the plurality of slanted nanostructures can be patterned directly on a glass substrate, and the slanted angle of each of the plurality of slanted nanostructures can be accurately controlled. Similarly, due to the alignment capabilities of lithography tools, the alignment of the each portion of the first and second materials in each alternating layer is accurately controlled. Moreover, the above-described methods of forming the plurality of nanostructures can be utilized with a number of lithography tools, allowing for greater flexibility and lower costs to implement the methods.

While the foregoing is directed to embodiments of the present disclosure, other and further embodiments of the disclosure may be devised without departing from the basic scope thereof, and the scope thereof is determined by the claims that follow.

What is claimed is:

1. A method of forming a plurality of nanostructures using a lithography tool, comprising:
    forming a first layer on a first surface of a transparent substrate, the first layer comprising first portions spaced from each other by one or more trenches, the first portions comprising a first material;
    depositing a second layer comprising a second material in the one or more trenches to form a first alternating layer comprising alternating first portions comprising the first material disposed in contact with second portions comprising the second material, the second material different than the first material;
    forming one or more additional alternating layers over the first alternating layer, each first portion of each alternating layer in contact with and offset from an adjacent first portion in adjacent alternating layers;
    removing each second portion from each alternating layer; and
    etching a sidewall of each first portion to smooth the sidewall and form the plurality of nanostructures comprising the first material.

2. The method of claim 1, wherein a sum of the alternating layers has a height from about 20 nm to about 2 μm.

3. The method of claim 1, wherein each of the first portions has a first width, the first width being greater than the first distance, and wherein the first distance is from about 10 nm to about 200 nm.

4. The method of claim 1, wherein the first material comprises Ti, Sb, Sn, Zr, Al, or Hf, and the second material comprises an organic planarization layer, spin on glass, SiN, or an Si containing material.

5. The method of claim 1, wherein the sidewall of each first portion is etched using $CH_3F$, $CH_4$, $CHF_3$, $CF_4$, or $O_2$.

6. The method of claim 1, wherein each alternating layer has a thickness from about 10 nm to about 100 μm.

7. The method of claim 1, wherein the lithography tool is a g-line, h-line, i-line, 248 nm, 193 nm, 193 nm immersion, or extreme ultraviolet lithography tool.

8. A method of forming a plurality of nanostructures using a lithography tool, comprising:
- forming a first layer on a transparent substrate, the first layer comprising first portions spaced from each other by one or more trenches, the first portions comprising a first material;
- depositing a second layer comprising a second material over the first material and in the one or more trenches to form a first alternating layer comprising first portions comprising the first material disposed in contact with second portions comprising the second material, the second material different than the first material;
  - forming one or more additional alternating layers over the first alternating layer, each second portion of each alternating layer disposed in contact with and offset from an adjacent second portion in adjacent alternating layers;
- removing one of the first portions or the second portions from each alternating layer; and
- etching a sidewall of the other of the first portions or the second portions to form the plurality of nanostructures.

9. The method of claim 8, wherein the sidewall is disposed at an angle from 0° to about 90° from a first surface of the transparent substrate.

10. The method of claim 8, wherein each of the second portions has a first width, the first width being greater than the first distance, and wherein the first distance is from about 10 nm to about 200 nm.

11. The method of claim 8, wherein the first material comprises Ti, Sb, Sn, Zr, Al, or Hf, and the second material comprises an organic planarization layer, spin on glass, SiN, or an Si containing material.

12. The method of claim 8, wherein the sidewall is etched using $CH_3F$, $CH_4$, $CHF_3$, $CF_4$, $O_2$, or Cl.

13. The method of claim 8, wherein a sum of the alternating layers has a height from about 20 nm to about 2 μm.

14. The method of claim 8, wherein the lithography tool is a g-line, h-line, i-line, 248 nm, 193 nm, 193 nm immersion, or extreme ultraviolet lithography tool.

15. A method of forming a plurality of nanostructures using a lithography tool, comprising:
- forming a first layer on a first surface of a transparent substrate, the first layer comprising first portions spaced from each other by one or more trenches, the first portions comprising a first material and the first material comprising a metal;
- depositing a second layer comprising a second material in the one or more trenches to form a first alternating layer comprising alternating first portions comprising the first material disposed in contact with second portions comprising the second material, the second material different than the first material;
- forming one or more additional alternating layers over the first alternating layer, each first portion of each alternating layer disposed in contact with and offset a first distance from an adjacent first portion in adjacent alternating layers, and wherein the first portions have a first width, the first width greater than the first distance; and
- removing either the first portions or the second portions from each alternating layer.

16. The method of claim 15, wherein the removing forms the plurality of nanostructures, and the method further comprises:
- etching a sidewall of each of the plurality of nanostructures to smooth the sidewall, wherein the sidewall is disposed at an angle from 0° to about 90° from the first surface of the transparent substrate.

17. The method of claim 16, wherein the first portions are removed from each alternating layer, and the sidewall is etched using $CH_3F$, $CH_4$, $CHF_3$, $CF_4$, $O_2$, or Cl.

18. The method of claim 16, wherein the second portions are removed from each alternating layer, and the sidewall is etched using $CH_3F$, $CH_4$, $CHF_3$, $CF_4$, or $O_2$.

19. The method of claim 15, wherein the first distance is from about 10 nm to about 200 nm, wherein each alternating layer has a thickness from about 10 nm to about 100 μm, and wherein a sum of the alternating layers has a height from about 20 nm to about 2 μm.

20. The method of claim 15, wherein the lithography tool is a g-line, h-line, i-line, 248 nm, 193 nm, 193 nm immersion, or extreme ultraviolet lithography tool.

* * * * *